United States Patent
Nielsen (10) Patent No.: US 12,072,040 B2
(45) Date of Patent: Aug. 27, 2024

(54) METHOD FOR DETERMINING A POSITION OF A BLOCKING ELEMENT IN A VALVE, A SENSOR SYSTEM AND USE OF A SENSOR SYSTEM

(71) Applicant: AVK Holding A/S, Galten (DK)

(72) Inventor: Karsten Skovgaard Nielsen, Silkeborg (DK)

(73) Assignee: AVK HOLDING A/S, Galten (DK)

( * ) Notice: Subject to any disclaimer, the term of this patent is extended or adjusted under 35 U.S.C. 154(b) by 0 days.

(21) Appl. No.: 17/768,072

(22) PCT Filed: Oct. 10, 2019

(86) PCT No.: PCT/DK2019/050312
§ 371 (c)(1),
(2) Date: Apr. 11, 2022

(87) PCT Pub. No.: WO2021/069035
PCT Pub. Date: Apr. 15, 2021

(65) Prior Publication Data
US 2024/0093803 A1 Mar. 21, 2024

(51) Int. Cl.
*F16K 37/00* (2006.01)
*F16K 31/46* (2006.01)

(52) U.S. Cl.
CPC .......... *F16K 37/0033* (2013.01); *F16K 31/46* (2013.01)

(58) Field of Classification Search
CPC ............. F16K 37/0033; F16K 37/0041; F16K 37/0083; F16K 31/508
See application file for complete search history.

(56) References Cited

U.S. PATENT DOCUMENTS

| 9,541,214 | B2* | 1/2017 | Penning .................. F16K 31/06 |
| 10,732,008 | B2* | 8/2020 | Takiguchi ........... F16K 37/0033 |
| 2017/0173822 | A1 | 6/2017 | Beaupre |
| 2017/0307103 | A1 | 10/2017 | Freudendahl |
| 2017/0328493 | A1 | 11/2017 | Engelbrektsson |

FOREIGN PATENT DOCUMENTS

| CN | 204922194 U | 12/2015 | |
| CN | 105849449 A | 8/2016 | |
| CN | 107269923 A | 10/2017 | |
| CN | 107580664 A | 1/2018 | |
| DE | 102016106181 A1 | 10/2017 | |
| EP | 3287996 A1 | 2/2018 | |
| EP | 3489559 A1 * | 5/2019 | ........... F16K 31/088 |
| GB | 2277185 A | 10/1994 | |

(Continued)

OTHER PUBLICATIONS

Machine English translation of DE102016106181 (Year: 2024).*

(Continued)

*Primary Examiner* — Hailey K. Do
(74) *Attorney, Agent, or Firm* — CANTOR COLBURN LLP (57) ABSTRACT

A method for determining a position of a blocking element in a valve having an operating device configured so that the blocking element moves between an open and a closed position in dependency of the direction in which the operating device is rotated. A sensor system is also provided for detecting a position of a blocking element in a valve.

24 Claims, 4 Drawing Sheets

(56) References Cited

FOREIGN PATENT DOCUMENTS

| WO | WO-03100950 A1 | * | 12/2003 | ............. F01P 7/167 |
| WO | 2016082833 A1 | | 6/2016 | |
| WO | 2018193058 A1 | | 10/2018 | |

OTHER PUBLICATIONS

Machine English translation of WO03100950 (Year: 2024).*
Machine English translation of EP3489559 (Year: 2024).*
International Search Report for corresponding application PCT/DK2019/050312 filed Oct. 10, 2019; Mail date Jul. 3, 2020.
Written Opinion of the International Searching Authority for corresponding application PCT/DK2019/050312 filed Oct. 10, 2019; Mail date Jul. 3, 2020.

* cited by examiner

METHOD FOR DETERMINING A POSITION OF A BLOCKING ELEMENT IN A VALVE, A SENSOR SYSTEM AND USE OF A SENSOR SYSTEM

TECHNICAL FIELD

The disclosure relates to a method for determining a position of a blocking element in a valve comprising an operating device configured so that the blocking element moves between an open and a closed position in dependency of the direction in which the operating device is rotated. The disclosure also relates to a sensor system for detecting a position of a blocking element in a valve and use of a sensor system.

BACKGROUND

Valves in e.g. a water distributing system are often scattered in large numbers over a large area and it can be a difficult task to keep track of which valves are open and which are closed. Particularly because the open/close status of a particular valve typically cannot be detected visually from outside the valve.

Thus, from European Patent Application no. EP 3 287 996 A1 it is known to provide a gate valve with a position indicator for detecting the open/close status of a valve, wherein the position indicator comprises a communication element for communicating the detected status to an external receiver. However, such a system will have to be designed to a specific valve type which is disadvantageous since valves exist in a multitude of makes and models.

The disclosure therefore provides for an advantageous technique for determining a position of a blocking element in a valve.

BRIEF SUMMARY

The disclosure provides for a method for determining a position of a blocking element in a valve comprising an operating device configured so that the blocking element moves between an open and a closed position in dependency of the direction in which the operating device is rotated, the method comprising the steps of:
  connecting at least a reference part or a sensor of a sensor system to the operating device, so that the sensor system detects the rotation angle of the operating device and the rotational direction of the rotations,
  calibrating the sensor system by
    rotating the operating device in a first direction until the blocking element reaches a first reference position in which the blocking element is in a fully closed or a fully open position,
    storing the first reference position as the fully closed or the fully open position in a memory,
    rotating the operating device in a second direction opposite the first direction until the blocking element performs a calibration stroke and reaches a second reference position of the fully closed or fully open position,
    storing the second reference position as the fully closed or the fully open position in the memory,
  rotating the operating device while detecting the rotation angle of the operating device and the rotational direction of the rotations by means of the sensor system, and
  determining the position of the blocking element based on the detected rotation angle and the detected rotational direction in relation to the first reference position and the second reference position.

Calibrating the sensor system by storing the extreme positions (i.e. the fully closed and the fully open position) in a memory and then determine the actual position of the blocking element in the valve by detecting the rotation angle and rotational direction of the operating device in relation to the stored extreme positions is advantageous in that this method then enables that the sensor system can be used to determine the open/close status of any type of valve no matter how many rotations is needed to move the blocking element between the fully closed and the fully open position on that specific valve. Thus, by means of this method the sensor system can be used efficiently on any valve and can easily be retrofitted on any valve no matter its make or model.

It should be noted that in this context the term "detects the rotation angle of the operating device" includes that not only is the angular position detected but also that this done so that the number of rotations of the operating device is also detected. I.e. the term is not limited to only detecting angles between 0 and 360 degrees but includes continuous detection of angles between e.g. 0 and 2,000 degrees or another range depending on the number of rotations needed to move the blocking element between a fully closed or a fully open position or vice versa. And by continuously is not necessarily meant that all angular positions are detected accurately. The term also includes determining the rotation angle in increments e.g. with a resolution of 10 degrees, 45 degrees, 90 degrees, 180 degrees or even 360 degrees so that only every full rotation was detected.

In an aspect of the disclosure, after having stored the second reference position, the calibration of the sensor system further comprises the step of rotating the operating device in the first direction again until the blocking element performs a first additional stroke and reaches the first reference position again and verifying correct calibration if the detected rotation angle of the calibration stroke is substantially the same as the detected rotation angle of the first additional stroke.

During the calibration process the fully open and fully closed position is typically detected manually e.g. by feeling the increase in resistance when rotating the operating—no matter if this is done manually or by actuator. However, particularly if the sensor system is retrofitted on an older valve, wear and tear can cause that resistance can be felt even if the blocking element is not in an extreme position. It is therefore advantageous to only verify correct calibration if the detected rotation angle of the calibration stroke is substantially the same as for the first additional stroke in that this will increase the chance of performing a correct calibration.

In an aspect of the disclosure, correct calibration is only verified if the sensor system detects that the rotational direction of the calibration stroke is opposite the rotational direction of the first additional stroke.

Also detecting that the rotational direction of the calibration stroke is opposite the first additional stroke is advantageous in that this will reduce the risk of calibration errors e.g. if the fully open or fully closed position was store during rotation in the same direction by mistake.

In an aspect of the disclosure, after having stored the second reference position, the calibration of the sensor system further comprises the step of rotating the operating device in the first direction again until the blocking element performs a first additional stroke and reaches the first reference position again where after the operating device is rotated in the second direction again until the blocking element performs a second additional stroke and reaches the second reference position again and verifying correct calibration if the detected rotation angle of two of the calibration stroke, the first additional stroke and the second additional stroke are substantially the same.

Only verifying correct calibration if two out of the three strokes are substantially identical is advantageous in that this will reduce the risk of calibration errors even if the sensor system is installed on an old valve where the resistance may vary much depending on rotational direction or may vary over a single stroke.

In an aspect of the disclosure, correct calibration is only verified if the sensor system detects that the rotational direction of the calibration stroke and/or the second additional stroke is opposite the rotational direction of the first additional stroke.

Also detecting that the rotational direction of the calibration stroke and/or the second additional stroke is opposite the first additional stroke is advantageous in that this will reduce the risk of calibration errors e.g. if the fully open or fully closed position was store during rotation in the same direction by mistake.

In an aspect of the disclosure, the method further comprises the step of activating the sensor system at least before storing the reference positions in response to an activation signal provided by an operator.

Once the sensor system is on it will use electrical power to power the sensors, the memory, communication devises and other. It is therefore advantageous that the system comprises the option of first being activating when it is about to be used. Thereby power can be saved during storage, transport, mounting and other.

In an aspect of the disclosure, the first reference position and the second reference position are stored in response to a store signal provided by an operator.

Making an operator provide a store signal to the sensor system is advantageous in that this will reduce the complexity of the system and aid in monitoring that the calibration process runs without errors.

In an aspect of the disclosure, the activation signal and/or the store signal is communicated wirelessly from an external wireless communication device.

The operating device of a valve is often placed in a surface box or a similar location at which it is not desirable to connect to the sensor system by means of a wire. Thus, it is safer and faster to communicate wirelessly with the sensor system.

In an aspect of the disclosure, the external wireless communication device is a mobile phone.

A mobile phone is typically readily available to an operator and communicating wirelessly with the sensor system by means of a mobile phone therefore provides simple and inexpensive means of communication.

Furthermore, the disclosure provides for a sensor system for detecting a position of a blocking element in a valve comprising an operating device configured so that the blocking element moves between an open and a closed position in dependency of the direction in which the operating device is rotated. The sensor system comprising at least one reference part and at least one sensor for detecting the reference part, wherein one of the reference part and the sensor comprises fixation means for being held in a fixed position and wherein the other of the reference part and the sensor comprises connection means for being rigidly connected to the operating device so that the reference part and the sensor is arranged to rotate in relation to each other if the operating device is rotated. The at least one reference part and the at least one sensor are arranged so that the rotation angle and the direction of rotations of the operating device is detected by means of the at least one sensor. The sensor system further comprises a memory for storing at least one reference position and an input receiver for receiving a store signal arranged to activate storage of the at least one reference position. The sensor system also comprises processing means arranged to determine a position of the blocking element based on the at least one reference position and input from the at least one sensor regarding rotation angle and the direction of rotations.

Providing a sensor system with a memory which is capable of storing reference positions is advantageous in that this enables that the sensor system can be used for detecting the position of a blocking element in any kind of valve because the reference positions can be stored uniquely for any kind of valve and the actual position of the blocking element thereby determined simply by means of processing means on the basis of input from a sensor regarding rotation angle and the direction of rotations in relation to the stored reference position or positions.

It should be noted that in this context the term "reference part" includes anything that can be detected by a sensor. I.e. the term includes any kind of magnet, light emitting or absorbing device, a sound emitter, variations in geometry, holes in a surface or other.

It should also be noted that in this context the term "fixation means" includes any kind of fixator capable of holding the reference part or the sensor in a fixed position. I.e. the term comprises any kind of screws, bolts, rivets, adhesive, interlocking geometry, clamping device or other or any combination thereof.

Furthermore, it should be noted that in this context the term "input receiver" includes any kind of receiver capable of receiving a store signal. I.e. the term comprises any kind of button, switch, wireless receiver, audio receiver, visual receiver or other or any combination thereof.

Further, it should be noted that in this context the term "connection means" includes any kind of connector capable of rigidly connecting the reference part or the sensor to the operating device. I.e. the term comprises any kind of screws, bolts, rivets, adhesive, interlocking geometry, clamping device or other or any combination thereof.

It should also be noted that in this context the term "processing means" includes any kind of processor capable of determining a position of the blocking element based on a reference position and input from a sensor regarding rotation angle and the direction of rotations. I.e. the term includes any kind of microprocessor, logical circuit, programmable or hardwired logic controller, data processing system or other or any combination thereof.

In an aspect of the disclosure, the input receiver comprises a wireless input receiver for receiving the store signal wirelessly.

Valve are often buried in the ground and it is therefore advantageous to be able to provide the store signal wirelessly in that wired connections or vulnerable buttons or switched hereby can be avoided.

In an aspect of the disclosure, the sensor system further comprises an external wireless communication device for communicating the store signal wirelessly to the input receiver.

Valves are often buried in the ground or placed at other remote and problematic places where it is not desirable to connect to the sensor system by means of a wire or where access to the sensor system is difficult due to the location or lack of space. Thus, it is safer and faster to make the sensor system comprises an external wireless communication device—such as a mobile phone, a dedicated communication device, a computer or other—for communicating the store signal wirelessly to the input receiver.

In an aspect of the disclosure, the sensor system further comprises a position indicator for communicating the determined position of the blocking element to a user.

Providing the sensor system a position indicator is advantageous in that the determined position of the blocking element hereby easily can be communicated to the user.

It should be noted that in this context the term "position indicator" includes any kind of visual indicator by which the visual state is changed in accordance with the determined position of the blocking element, any kind of audio indicator by which an audio state is changed in accordance with the determined position of the blocking element, any kind of position communicator which is capable of electronically communicating the determined position of the blocking element—including wireless electronical communication or other or any combination thereof.

In an aspect of the disclosure, the sensor system further comprises a wireless position communicator for communicating the determined position of the blocking element wirelessly to an external wireless communication device.

E.g. in a water distributing system a large number of valves are scattered over a large area and it is therefore advantageous to provide the sensor system with a wireless position communicator so that determined position more easily may be read and enabling that sensor systems at several different valves may be read wirelessly by the same external wireless communication device.

In an aspect of the disclosure, the sensor system further comprises a power unit for supplying electrical power at least to the sensor and the processing means.

The valves are often positioned at remote locations where it would be difficult or expensive to provide a power connection to an external power source—such as the grid—and it is therefore advantageous to provide the sensor system with its own power unit. Furthermore, an integrated power unit enables a simpler installation of the sensor system.

It should be noted that in this context the term "power unit" includes any kind of power generator capable of generating and/or supplying electrical power. I.e. the term comprises any kind of battery, fuel cell, solar cell, generator driven by an internal combustion engine or other or any combination thereof.

In an aspect of the disclosure, the at least one reference part comprises at least one permanent magnet.

Permanent magnet requires no power source to work and are very reliable. Thus, using permanent magnet as reference part is advantageous—especially given the often remote location at which the sensor system has to be installed.

In an aspect of the disclosure, the at least one sensor comprises at least one Hall effect sensor.

Hall effect sensors are very reliable and only consumes very little power during operation and are therefore particularly suited as sensors in a sensor system to be used on valves.

In an aspect of the disclosure, the at least one reference part is formed by a first magnet and a second magnet arranged on opposite sides of a rotational axis of the operating device and so that the polarity of the first magnet and second magnet is opposite to each other in a direction parallel with the rotational axis.

Forming the reference part by means of two permanent magnets arranged with opposite polarity in the direction of rotational axis of the operating device is advantageous on that a simple and reliable reference part hereby is formed enabling that different rotational positions may be identified.

In an aspect of the disclosure, the at least one sensor comprises two sensors arranged in a mutual displacement angle of 90 degrees in a plane perpendicular to the rotational axis of the operating device.

Forming the sensor by means of two sensors spaced 90 degrees apart enables in a simple and reliable way that the rotational position can be determined with a 90 degree resolution and that the rotational direction can be determined in a simple and reliable manner by detecting the polarity of the magnet present under each of the two sensor.

In an aspect of the disclosure, the operating device comprises an extension device extending from the valve.

Valves are often buried under the ground surface and it is therefore advantageous to make the operating device of the valve comprises an extension device so that the valve may be operated from the ground surface.

In an aspect of the disclosure, the at least one reference part or the at least one sensor is held in a fixed position in relation to the valve.

Hereby is achieved an advantageous embodiment of the disclosure.

In an aspect of the disclosure, the least one reference position comprises at least a first reference position corresponding to a position in which the blocking element is in one of a fully closed or a fully open position, and a second reference position corresponding to a position in which the blocking element is in the other of the fully closed or fully open position.

Storing the reference position corresponding to the position in which the blocking element is in a fully closed state, and the position in which the blocking element is in a fully open state is advantageous in that this enables a faster and more precise determination of the blocking element during use of the sensor system.

In an aspect of the disclosure, at least the at least one sensor, the memory, the input receiver and the processing means are formed as a single interconnected unit.

Arranging the sensor, the memory, the input receiver and the processing means in a single coherent unit is advantageous in that this will simplify handling and installation.

In an aspect of the disclosure, the sensor system further comprises a temperature sensor.

Providing the sensor system with a temperature sensor is advantageous in that it enables that the temperature of the sensor system can be monitored to e.g. compensate the determined position in relation to very high or low temperatures to achieve a more precise determination of the actual position of the blocking element. Furthermore, e.g. in relation to water distributing systems the valves are often located along existing infrastructure e.g. in or along the roads in a city. And the sensor system is often located in a surface box in or at these roads. Thus, it is advantageous to also make the sensor system comprises a temperature sensor in that the distributed sensor systems hereby also could be used to monitor road temperatures and/or provide more precise local temperatures.

In an aspect of the disclosure the memory comprises means for storing at least two reference positions.

Storing more reference positions enables that a more precise and faster determination of the position of the blocking element can be achieved.

In an aspect of the disclosure the method according to any of the previously disclosed methods is performed by means of a sensor system according to any of the previously discussed sensor systems.

Hereby is achieved an advantageous embodiment of the disclosure.

The disclosure also provides for use of a sensor system according to any of the previously discussed for detecting a position of a blocking element in a multi-turn valve.

In relation to quarter-turn valves—such as butterfly valves, ball valves and plug valves—it is fairly easy to visually detect the open/close status of the valve by observing the position of the operating device—i.e. the handle. However, the operating device of a multi-turn valve—such as a gate valve, a globe valve, a fixed cone valve, a needle valve, a pinch valve and other—will have to be rotated several full rotations to move the blocking element from an open to a closed position and vice versa. Thus, for a gate valve it is not possible to determine the open/close status of the valve simply by observing the position of the operating device. Thus, it is particularly advantageous to use the present disclosure in relation to multi-turn valves.

BRIEF DESCRIPTION OF THE FIGURES

An embodiment of the disclosure will be described, by way of non-limiting example, in the following with reference to the figures in which.

DETAILED DESCRIPTION

Figure 1:
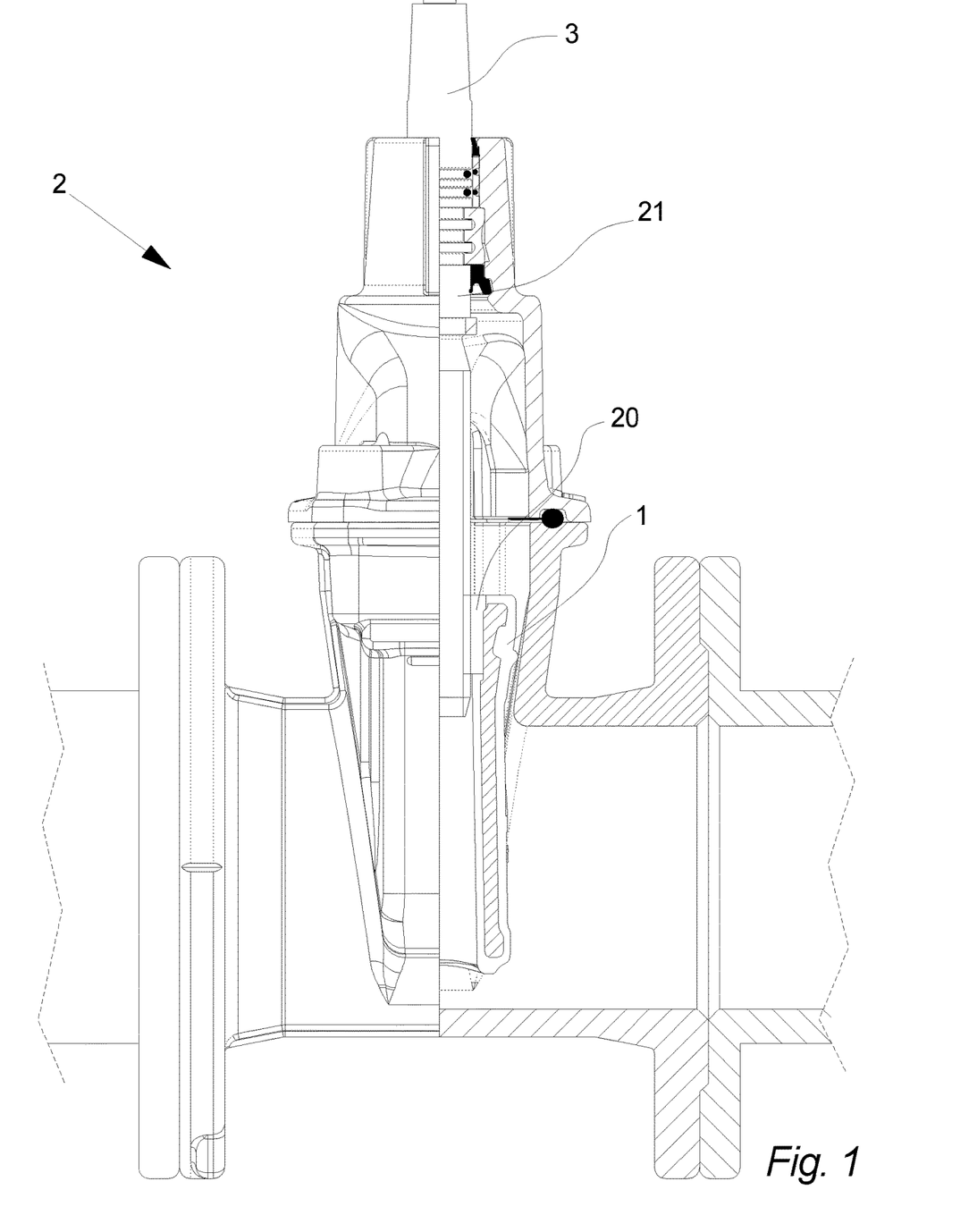
FIG. 1 illustrates a partial cross section through the middle of a valve, as seen from the side.

FIG. 1 illustrates a partial cross section through the middle of a valve 2, as seen from the side.

In this embodiment the valve 2 is a gate valve comprises a blocking element 1 in the form of a vertically displaceable wedge comprising a wedge nut 20. The valve 2 also comprises an operating device 3 located at the upper end of a substantially centrally arranged spindle 21, wherein the other end of the spindle 21 engages the wedge nut through a helical spline thereby enabling that when the operating device 3 is mechanical manipulated—i.e. rotated—the spindle 21 will rotate and vertically displace the nut 32 and thereby the wedge 31 to raise or lower and thereby open or close the valve 2 to control the flow of a fluid through the valve 2.

However, in another embodiment the valve 2 could be another type of multi-turn valve where the spindle 21 and the operating device 3 will have to rotated more than one full rotation to move the blocking element 1 from an open position to a closed position—such as any kind of globe valve, fixed cone valve, needle valve, pinch valve or another type of valve 2 suited for controlling a flow of fluid through a pipe to which the valve 2 is connected—i.e. in another embodiment the blocking element 1 could comprise a plug, a disc, a needle, a hatch, a flexible sleeve, a pinching device or other.

Also in another embodiment the operating device 3 could also or instead comprise a lever, a handle, a wheel or other and/or the operating device 3 could comprise another external shape and/or an internal shape suited for being engaged by a handle, a tool, a key, an actuator or other so that the valve 2 may be manipulated in order to actuate the blocking element 1 in the valve 2.

Figure 2:
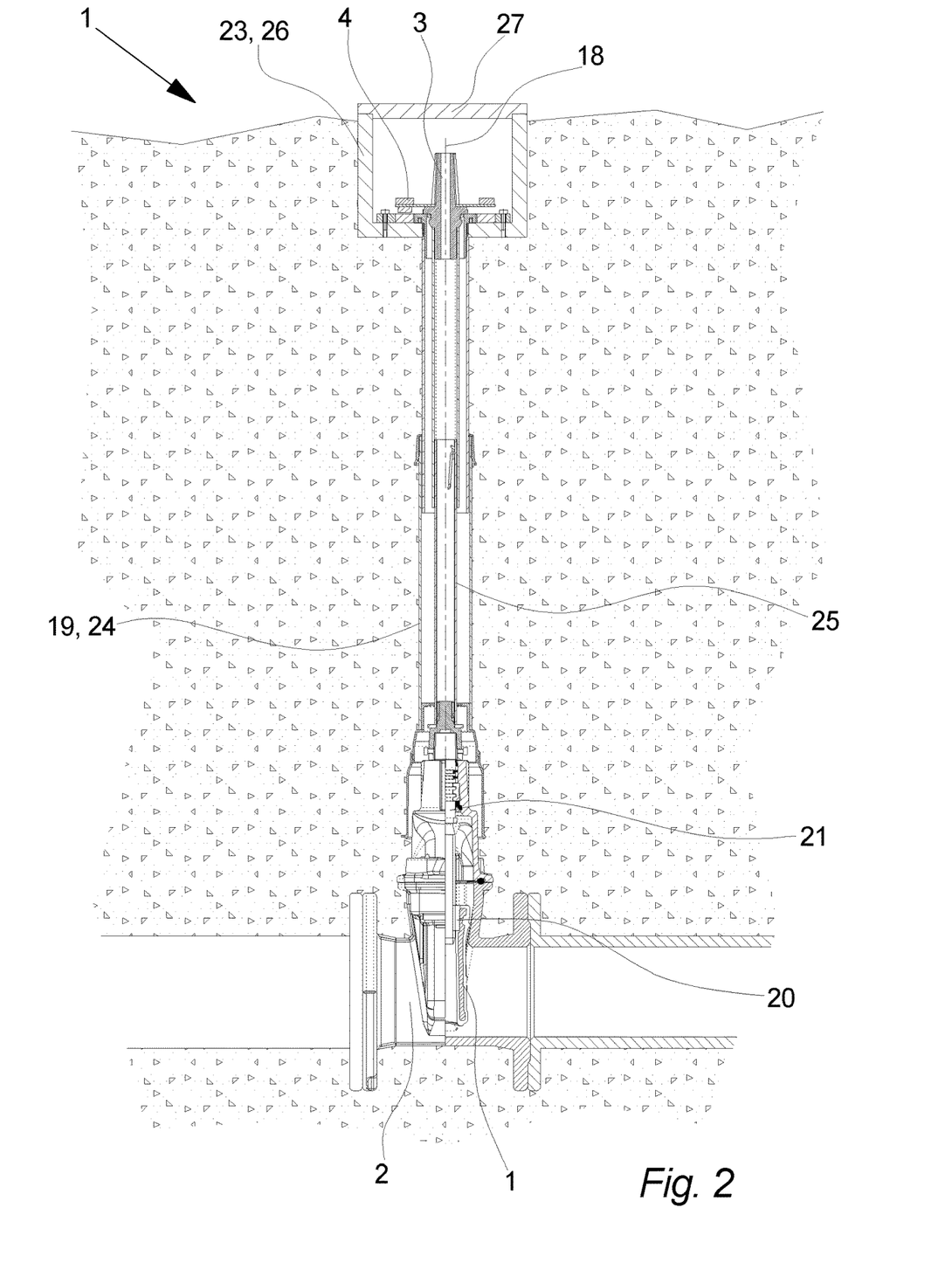
FIG. 2 illustrates the valve of FIG. 1 with a cross section through the middle of an extension device, a surface box and a sensor system, as seen from the side.

FIG. 2 illustrates the valve of FIG. 1 with a cross section through the middle of an extension device 19, a surface box 23 and a sensor system 4, as seen from the side.

In this embodiment the operating device 3 of a buried valve 2 comprises an extension device 19 formed by an extension device housing 24 substantially surrounding an inner extension rod 25. At ground surface the extension rod 25 of the extension device 19 extends up into a surface box 23 to enable that the operating device 3—comprising the extension device 19—may easily be accessed and manipulated at ground level. However, in another embodiment the extension device 19 could be formed in numerous other ways such as a simple extension rod, it could also or instead comprise rotational gears to displace the rotational axis or to gear the rotation of the operating device 3, it could also or instead comprise brakes or couplings, it could also or instead comprise joints such as universal joint or other.

In this embodiment the surface box 23 comprises a surface box housing 26 having a bottom opening at the bottom through which the operating device 3 extends up into the surface box housing 26. In this embodiment the surface box 23 is cylindrical but in another embodiment, it could be square, triangular or have a different shape.

In this embodiment the surface box housing 26 is placed in the ground so that the top of the surface box 23 is substantially level with the ground surface. However, in another embodiment the surface box 23 could be arranged deeper in the ground or it could be placed more or less on or over ground level.

In this embodiment the surface box housing 26 also has an upper opening arranged at the top of the surface box housing 26 opposite the bottom opening. The upper opening enables access to the inside of the surface box 23.

In this embodiment the surface box 23 further comprises a lid 27 arranged to cover said upper opening and thereby protect the inside of the surface box 23 from unwanted access, water, foreign elements and other.

In this embodiment the sensor system 4 is arranged on the operating device 3 inside the surface box 23. However in another embodiment the sensor system 4 would be mounted directly on the valve 2 or elsewhere in connection with the operating device 3 e.g. if the operating device 3 does not comprise an extension device 19 or it comprises another type of extension device 19.

Figure 3:
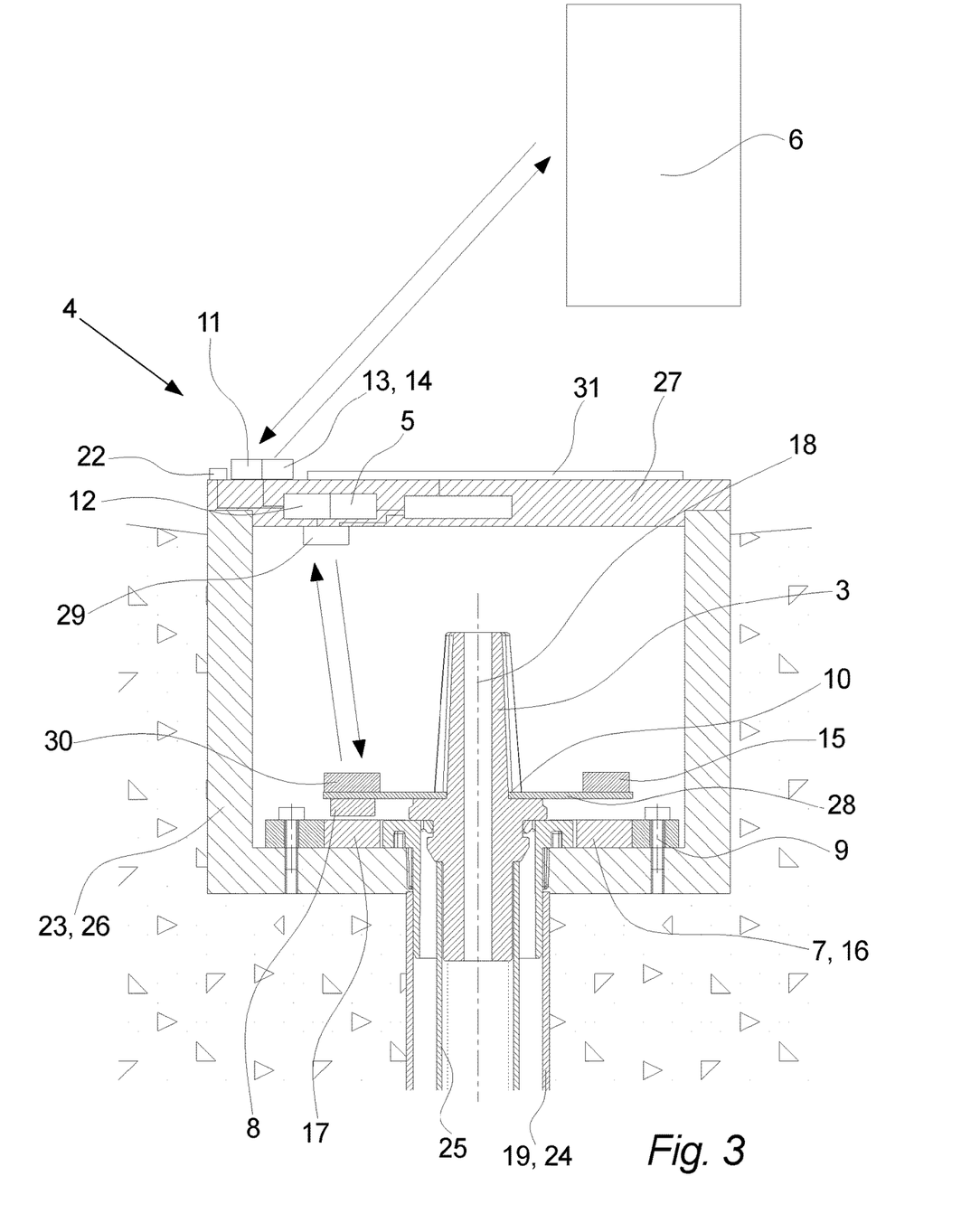
FIG. 3 illustrates a cross section through the middle of a sensor system mounted in a surface box, as seen from the side.

FIG. 3 illustrates a cross section through the middle of a sensor system 4 mounted in a surface box 23, as seen from the side.

In this embodiment the sensor system 4 comprise a reference part 7 comprising fixation means 9 in the form of a bolt connection for holding the reference part 7 in a fixed position. In this embodiment the fixation means 9 fixes the position of the reference part 7 in relation to the fixed surface box 23 but in another embodiment the fixation means 9 could rigidly connect the reference part 7 to another component, such as a dedicated fitting or bracket, to the valve housing or another fixed part of the valve 2, to a fixed building component, to the ground or to another object, part or entity having a fixed position in relation to the operating device 3 device when it rotates.

However, in another embodiment the reference part 7 could instead be connected to the operating device 3 by means of connection means 10 ensuring that the reference part 7 would rotate with the operating device 7 when it is rotated.

Figure 4:
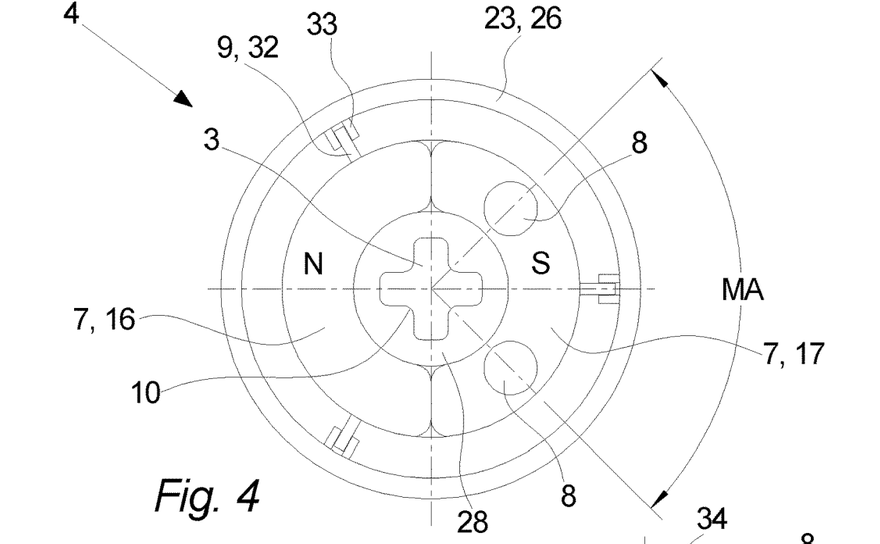
FIG. 4 illustrates a sensor system comprising two sensors, as seen from the top.

In this embodiment the reference part 7 is formed by two permanent magnet parts 16, 17 arranged so that they have opposite polarity in the direction of the rotational axis 18 of the operating device 2 as will discussed in more details in relation to FIG. 4.

In this embodiment the sensor system 4 also comprises a sensor 8 including connection means 10 in the form of a center hole in a sensor bracket 28 carrying the sensor 8, wherein the center hole is cut to fit tightly onto the star shaped operating device 3 so that the sensor bracket 28 and thereby the sensor 8, will rotate along with the operating device 3 when this is rotated. I.e. in this embodiment the sensor 8 is indirectly connected to the operating device 3 through the sensor bracket 28 but in another embodiment the sensor 8 could be directly connected onto the operating device 3 or the sensor 8 could be indirectly connected to the operating device 3 through another type of bracket, through a gearing, through a support or other allowing the sensor 8 to rotate along with the operating device 3.

In this embodiment the sensor 8 is actually two sensors spaced 90 degrees apart as discussed in relation to FIG. 4. In FIG. 3 only one of these two sensors 8 are visible. However, in another embodiment the sensor 8 could only comprise a single sensor, three sensors, four sensors or even more separate or integrated sensors.

In another embodiment the sensor 8 could instead be the fixed part of the sensor system 4 if it instead of the reference part 7 was held in a fixed position by fixation means 9 ensuring that the at least one sensor 8 would not rotate with the operating device 7 when it is rotated.

In this embodiment the sensor 8 is arranged to rotate directly over the reference part 7 so that the sensor 8 can detect different rotational positions by means of the reference part 7. However, in another embodiment the sensor 8 could be arranged to rotate under the reference part 7, outside the reference part 7 or inside the reference part 7 or vice versa if the reference part was arranged to rotate with the operating device 3.

Figures 5, 6:
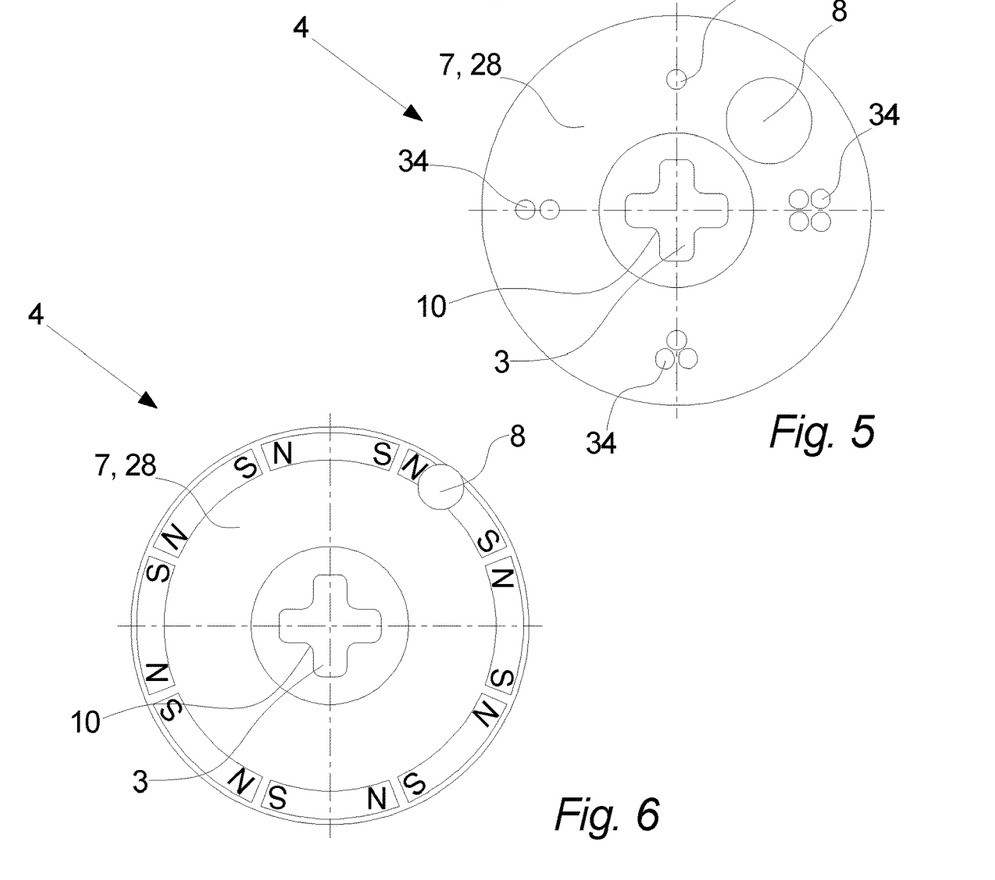
FIG. 5 illustrates a sensor system comprising one sensor, as seen from the top.
FIG. 6 illustrates a sensor system comprising one sensor and multiple magnets, as seen from the top.

In this embodiment the at least one sensor 8 is arranged in relation to the reference part 7 so that the rotation angle and the direction of rotations of the operating device 3 is detected by means of the at least one sensor 8 as will discussed further in relation to FIGS. 4 and 5.

In this embodiment the sensor system 4 further comprises a memory 5 for storing at least one reference position and an input receiver 11 for receiving a store signal which will activate storage of a reference position in the memory 5 in response to the store signal. In this embodiment the sensor system 4 also comprises processing means 12, a wireless position communicator 14, a first and a second internal communicator 29, 30 and a power unit 15 for supplying electrical power to the electrical power consuming components of the sensor system 4.

In this embodiment the input receiver 11 is also arranged to receive an activation signal which will active the sensor system 4. During storage, handling, mounting etc. internal power from the power unit 15 to the sensors 8, the wireless position communicator 14 and the first and second internal communicators 29, 30 is cut off by means of the processing means 12 to save power so that only the memory 5, the input receiver 11 and at least parts of the processing means 12 will be powered. In response to receiving an activation signal by the input receiver 11 the processing means 12 will enable full power to all parts of the sensor system 4—when needed—and the sensor system will be in full operating mode. However, in another embodiment more, less or other components could be without power until the activation signal is provided and/or the system 4 could comprise more than one activation state so that the activation signal would enable the sensor system 4 enter normal operation mode but a power saving signal would enable the sensor system 4 to enter power saving mode. Also, in another embodiment a close down signal would enable a full shut down of the system 4 or other signal and modes could be included.

In this embodiment the activation signal is received wirelessly from an external communication device 6 in the form of a mobile phone communicating wirelessly with the input receiver 11 but in another embodiment the activation signal could be received through a wired arrangement, through the push of a button on the sensor system 4, through a user interface integrated in the sensor system 4, through a remote control or another way. Or in another embodiment the sensor system 4 would be always on or the sensor system 4 would be activated by connecting the power unit 15 to the sensor system 4.

In this embodiment the processing means 12 is determining the actual position of the blocking element 1 on the basis of the at least one reference position stored in the memory 5 and current input from the at least one sensor 8 regarding rotation angle and direction of rotations. I.e. by detecting the number of rotations (the rotation angle) and the direction of rotation the processing means 12 can determine the actual position of the blocking element 1 by determining how far the blocking element has travelled from (i.e. in relation to) the at least one reference position.

In this embodiment the sensor system 4 also comprises a position indicator 13 for communicating the position of the blocking element 3 determined by the processing means 12 to a user. In this embodiment this is done through a wireless position signal being send from the position indicator 13 to the external communication device 6 where the user can read the position on the interface of the external communication device 6. Communication with the external communication device 6 is in this embodiment done by Bluetooth but in another embodiment the wireless communication could take place by means of Near-field communication (NFC), Zigbee or another wireless protocol.

However, in another embodiment the position indicator 13 could also or instead include a dedicated display, a diode changing color in response to the detected position, other visual, audial or tactile indicators and/or the position signal could be send by wire from the position indicator 13 or it could be send wirelessly to a cloud storage, to a central backend or other. I.e. in another embodiment the position indicator 13 would also or instead comprise means for long range wireless communication via e.g. WIFI, Sigfox, LoRa or another communication protocol. In another embodiment of the disclosure the sensor system 4 would further comprise a relay unit or a repeater unit for receiving data from one or more other sensor systems 4 and repeating it on to another sensor system 4, to a central unit, to a concentrator or other.

In this embodiment the input receiver 11, the memory 5, the processing means 12, the position indicator 13, a first internal communicator 29 and a power unit 15 are all integrated with the lid 27 of the surface box 23. However, in another embodiment fewer or more components of the sensor system 4 could be placed in or on the lid 27, some of the components of the sensor system 4 could also or instead be placed in or on the surface box housing 26 and/or on, in or at another surface or object close to the operating device 3 or all the components of the sensor system 4—except for the external communication device 6 if this forms part of the sensor system 4—could be formed as a single interconnected unit.

When the operating device 3 is located in a surface box 23 it is advantageous to place at least the position indicator 13 and the input receiver 11 in or on the upper outside surface of the surface box 23 to enable simpler and more reliable wireless communication to and from the external communication device 6—i.e. in this embodiment the position indicator 13 and the input receiver 11 are placed on the lid 27 of the surface box 23.

When at least some of the components of the sensor system 4 are placed on or at the operating device 3 and some of the components of the sensor system 4 are placed at another nearby location—e.g. in and on the lid 27 as disclose in FIG. 3—components at the two locations will have to communicate. In this embodiment this is done wirelessly by means of the first internal communicator 29 arranged on the lid 27 communicating wirelessly with the second internal communicator 30 arranged on the sensor bracket 28 to enable that the lid may easily be removed from the surface box 23 because no wires are connecting the two parts of the sensor system 4. However, in another in another embodiment this communication could also or instead take place by means of a wired connection.

In this embodiment the first internal communicator 29 and the second internal communicator 30 communicates wirelessly with each other through Bluetooth but in another embodiment the wireless communication could take place by means of Near-field communication (NFC), Zigbee or another wireless protocol.

Also, when at least some of the components of the sensor system 4 are placed away from the operating device 3 it is also advantageous to provide the sensor system 4 with more than one power unit 15. I.e. in this embodiment a power unit 15 is placed on the sensor bracket 28 and another power unit is placed on the lid 27. However, in another embodiment all the power consuming components could be powered from the same power unit 15 even is the components are spaced apart.

In this embodiment the sensor system 4 is further provided with a solar cell 31 connected to the power unit 15 in the lid to provide power to the power unit 15. However, in another embodiment the sensor system 4 could also or instead be provided with a fuel cell, a generator or other means for providing electrical power to the electrical power consuming components of the sensor system 4. In another embodiment the sensor system 4 could also or instead be connected an external electrical power supply such as the electrical grid.

In this embodiment the sensor system 4 further comprises a temperature sensor 22 arranged in the lid 27 of the surface box 23. I.e. in this embodiment the sensor system can also detect and communicate the ground surface temperature. However, in another embodiment a temperature sensor 22 could also or instead be placed on the sensor bracket 28 or elsewhere on or at the operating device 3. In another embodiment the sensor system 4 could also or instead comprise other sensors like rain sensors, moist sensors, smog sensors, tamper sensors, light sensors or other kinds of sensors enabling that additional information could advantageously be provided by the sensor system 4 given that the sensor systems can be distributed advantageously in relation to e.g. get a good and well distributed data overview.

In this embodiment the position of the blocking element 1 in the valve 2 is determined by initially connecting the sensor 8 of the sensor system 4 to the operating device 3 and fixating the reference part 7 against rotation by connecting it to the surface box housing 26 so that the rotation angle of the operating device 3 and the rotational direction of these rotations can be detected by the corresponding mutual motion of the reference part 7 and the sensor 8. However, as previously discussed the position of the sensor 8 and reference part 7 can be switched.

Before positions can be determined, the system 4 will in this embodiment have to be calibrated. This is done by rotating the operating device 3 in a first direction until the blocking element 1 reaches a first reference position in which the blocking element 1 is in a fully closed or a fully open position. The operating device 3 is typically manually operated by means of a dedicated key and the operator will feel when an extreme position has been reached through the resistance—i.e. the operator cannot turn the operating device 3 any further in the same direction even if the operator tries harder. The operator (also called a user) will then provide a store signal to the sensor system 4 in response to which a first reference position is stored as a fully closed or a fully open position in the memory 5. In this embodiment the operator will know if the blocking element 1 is in the open or the closed position through visual indications at the operating device 3 regarding which way to turn the operating device 3 to open or close the valve 2 and the operator is therefore able to send information regarding if it is the open or the closed position that have been reached when sending the store signal. However, in another embodiment the operator would only send a store signal and the sensor system 4 would be able to detect if it is the closed or the open position based on the direction of rotation leading to that specific position. In this embodiment the store signal is provided by means of a dedicated application or program installed on the operator's mobile phone but as discussed above it could be provided in numerous other ways. Once the first position is stored as the open or closed position the operator now rotates the operating device 3 in the opposite direction until the blocking element 1 performs a full calibration stroke and reaches the other extreme position—i.e. the second reference position corresponding to the other of the fully closed or fully open position. Obviously if the first reference position is the open position, the second position is the closed position and vice versa. The operator then provides a store signal to store this second reference position as the fully closed or the fully open position in the memory 5. The calibration procedure has now been finished and the sensor system now knows in which position the blocking element 1 is in and how many rotations it takes to bring it in the opposite extreme position. Thus, when the operating device 3 is rotated, the rotation angle of the operating device 3 and the rotational direction of these rotations will be detected by the sensor 8 of the sensor system 4, and the processing means 12 is thereby capable of determining the actual position of the blocking element 3 from the travelled rotation angle and the direction in relation to the stored first and second reference positions.

However, in another embodiment the calibration procedure could further comprise that after having stored the second reference position, the operator would rotate the operating device 3 in the first direction again until the blocking element 1 performs a first additional stroke and reaches the first reference position again. Correct calibration would then only be verified if the detected rotation angle of the calibration stroke is substantially the same as the detected rotation angle of the first additional stroke. Correct calibration would be verified by sending a calibration verification signal to the external wireless communication device 6 so that the operator knowns that the sensor system 4 is correctly calibrated and ready for normal operation. If correct calibration would cannot be verified this will also be informed to the operator through the external wireless communication device 6 and the operator will have to redo the calibration procedure. However, in another embodiment correct/incorrect calibration could also or instead be communicated in the same way and by the same means as previously exemplified in relation to the position indicator.

In this embodiment the calibration verification signal is transmitted to the external wireless communication device 6 by means of the position indication which in this embodiment a transmitter transmitting by means of the Bluetooth protocol but in another embodiment the sensor system 4 could comprise dedicated means for transmitting the calibration verification signal and the signal could be transmitted by means of another protocol as previously exemplified.

In another embodiment the correct calibration is also only verified if the sensor 8 of the sensor system 4 detects that the rotational direction of the calibration stroke is opposite the rotational direction of the first additional stroke to reduce the risk of incorrect calibration.

In another embodiment the calibration procedure could further comprise that after having stored the second reference position, the calibration procedure further comprises rotating the operating device 3 in the first direction again until the blocking element 1 performs a first additional stroke and reaches the first reference position again where after the operating device 3 is rotated in the second direction again until the blocking element 1 performs a second additional stroke and reaches the second reference position again. Correct calibration would then only be verified if the detected rotation angle of two of the calibration stroke, the first additional stroke and the second additional stroke are substantially the same and if the sensor 8 of the sensor system 4 detects that the rotational direction of the calibration stroke and/or the second additional stroke is opposite the rotational direction of the first additional stroke.

FIG. 4 illustrates a sensor system 4 comprising two sensors 8, as seen from the top.

In this embodiment the sensor system 4 comprises a reference part 7 including a disc formed by two permanent magnets 16, 17. The first magnet 16 has north facing upwards toward the sensors 8 and the second magnet 17 has south facing upwards toward the sensors 8. However, in another embodiment the magnets 16, 16 could instead be arranged with the same polarity in the same direction but with different strength.

In this embodiment the reference part 7 comprises fixation means 9 in the form of protruding arms 32 arranged to engage protruding walls 33 of the surface box housing 24 so that the reference part 7 is fixed against rotation in relation to the operating device 3. In this embodiment the sensor system 4 further comprises two sensors 8 spaced apart in a mutual displacement angle MA of 90 degrees. However, in another embodiment the mutual displacement angle MA could be smaller such as 75, 60, 45 degrees or even less or the mutual displacement angle MA could be bigger such as 120, 135, 180 degrees or even more. And/or the system 4 could comprise another number of sensors 8 such as one, three, four or even more.

In this embodiment the sensors 8 are connected to the operating device 3 by means of connection means 10 (not shown in FIG. 4) so that the sensors will rotate over the reference part 7 when the operating device 3 is being rotated.

When the sensors 8 rotate, one of the two sensors 8 will move from one of the two magnets 16, 17 to the other of the two magnets 16, 17 and the change of polarity will be detected by this sensor 8. When it is known which of the two sensors detected the change in polarity, the direction of rotation is thereby also detected. And by tracking how many times each sensor detects a change in polarity (and in which order this happens) the rotation angle (i.e. the number of rotations) can thereby also be detected with a resolution of 90 degrees.

In this embodiment the sensors 8 are Hall effect sensors suited for detecting the change in polarity and the reference part 7 comprises magnets but in another embodiment the sensors 8 could be inductive sensors where the reference part 7 where the first magnet part 16 in FIG. 4 would be formed by a ferrous metal and the second magnet part 17 in FIG. 4 would be formed by a nonferrous metal so that the inductive sensors would detect the change in metal.

FIG. 5 illustrates a sensor system 4 comprising one sensor 8, as seen from the top.

In this embodiment the reference part 7 is formed by a disc comprising magnet arrangements 34 with a different number of permanent magnets for different 90 degree positions. Thus, in this embodiment a single sensor will be able to detect the rotation angle and the rotational direction by detecting the change in the size of the magnet field at different positions. In another embodiment of this principle the magnet would be formed more or less continuous but with increasing magnetic field so that the resolution was improved and there would be no "dead positions" where the sensor 8 would not detect a magnet.

FIG. 6 illustrates a sensor system 4 comprising one sensor 8 and multiple magnets 16, 17, as seen from the top.

In this embodiment the reference part 7 comprises a number of magnets arranged substantially end to end with north facing in the same rotational direction for all the magnets. Thus, when the sensor 8 or the reference part rotates with the operating device 3 the direction of rotation can be detected by the sensor by monitoring if the change in polarity happens gradually—when passing over the same magnet—or whether it happens abruptly when passing over a neighboring magnet. The resolution of the detected rotation angle will be defined by the number of magnet and in this embodiment the resolution is therefore 45 degrees.

In relation to FIGS. 4, 5 and 6 different specific embodiments of sensors 8 and reference parts 7 have been discussed. However, the skilled person would know that the rotation angle and direction could be detected in numerous other ways. E.g. in another embodiment the sensors 8 and reference parts 7 could also or instead be formed as a rotary encoder system where the sensor 8 was a photocell arranged to detect holes in a rotating disc forming the reference part e.g. with increasing hole size to detect direction or the rotation angle and direction could be detected by means of a potentiometer system, a tachometer or other.

The disclosure has been exemplified above with reference to specific examples of valves 2, blocking elements 1, sensor systems 4 and other. However, it should be understood that the disclosure is not limited to the particular examples described above but may be designed and altered in a multitude of varieties within the scope of the disclosure as specified in the claims.

The invention claimed is:
1. A method for determining a position of a blocking element in a valve comprising an operating device configured so that said blocking element moves between an open and a closed position in dependency of a rotational direction in which said operating device is rotated, said method comprising the steps of:
connecting at least a reference part or a sensor of a sensor system to said operating device, so that said sensor system detects a rotation angle of said operating device and the rotational direction of said rotations,
calibrating said sensor system by
rotating said operating device in a first direction until said blocking element reaches a first reference position in which said blocking element is in a fully closed or a fully open position,
storing said first reference position as said fully closed or said fully open position in a memory,
rotating said operating device in a second direction opposite said first direction until said blocking element performs a calibration stroke and reaches a second reference position of said fully closed or fully open position,
storing said second reference position as said fully closed or said fully open position in said memory,
rotating said operating device in said first direction again until said blocking element performs a first additional stroke and reaches said first reference position again and verifying correct calibration if a detected rotation angle of said calibration stroke is substantially the same as the detected rotation angle of said first additional stroke,
rotating said operating device while detecting said rotation angle of said operating device and said rotational direction of said rotations by means of said sensor system, and
determining the position of said blocking element based on said detected rotation angle and said detected rotational direction in relation to said first reference position and said second reference position.

2. A method according to claim 1, wherein correct calibration is only verified if said sensor system detects that the rotational direction of said calibration stroke is opposite the rotational direction of said first additional stroke.

3. A method according to claim 1, wherein said first reference position and said second reference position are stored in response to a store signal provided by an operator.

4. A method according to claim 1, wherein after having stored said second reference position, calibrating said sensor system further comprises the step of rotating said operating device in said second direction again after said blocking element performs said first additional stroke until said blocking element performs a second additional stroke and reaches said second reference position again and verifying correct calibration if the detected rotation angle of two of said calibration stroke, said first additional stroke and said second additional stroke are substantially the same.

5. A method according to claim 4, wherein correct calibration is only verified if said sensor system detects that the rotational direction of said calibration stroke and/or said second additional stroke is opposite the rotational direction of said first additional stroke.

6. A method according to claim 1, wherein said method further comprises the step of activating said sensor system, at least before storing said reference positions, in response to an activation signal provided by an operator.

7. A method according to claim 6, wherein said activation signal and/or a store signal is communicated wirelessly from an external wireless communication device.

8. A method according to claim 7, wherein said external wireless communication device is a mobile phone.

9. A sensor system for detecting a position of a blocking element in a valve comprising an operating device configured so that said blocking element moves between an open and a closed position in dependency of a direction in which said operating device is rotated, said sensor system comprising
at least one reference part, wherein said at least one reference part is formed by a first magnet and a second magnet arranged on opposite sides of a rotational axis of said operating device and so that a respective polarity of said first magnet and second magnet is opposite to each other in a direction parallel with said rotational axis,
at least one sensor for detecting said at least one reference part,
wherein one of said at least one reference part and said at least one sensor comprises fixator for being held in a fixed position and wherein the other of said at least one reference part and said at least one sensor comprises connector for being rigidly connected to said operating device so that said at least one reference part and said at least one sensor is arranged to rotate in relation to each other if said operating device is rotated and wherein said at least one reference part and said at least one sensor are arranged so that a rotation angle and the direction of rotations of said operating device is detected by means of said at least one sensor,
wherein said at least one sensor system further comprises
a memory for storing at least one reference position,
an input receiver for receiving a store signal arranged to activate storage of said at least one reference position, and
processing means arranged to determine said position of said blocking element based on said at least one reference position and input from said at least one sensor regarding rotation angle and said direction of rotations.

10. A sensor system according to claim 9, wherein said input receiver comprises a wireless input receiver for receiving said store signal wirelessly.

11. A sensor system according to claim 9, wherein said sensor system further comprises an external wireless communication device for communicating said store signal wirelessly to said input receiver.

12. A sensor system according to claim 9, wherein said sensor system further comprises a position indicator for communicating a determined position of said blocking element to a user.

13. A sensor system according to claim 9, wherein said sensor system further comprises a wireless position communicator for communicating a determined position of said blocking element wirelessly to an external wireless communication device.

14. A sensor system according to claim 9, wherein said sensor system further comprises a power unit for supplying electrical power to the at least one sensor and to a processor.

15. A sensor system according to claim 9, wherein said at least one reference part comprises at least one permanent magnet.

16. A sensor system according to claim 9, wherein said at least one sensor comprises at least one Hall effect sensor.

17. A sensor system according to claim 9, wherein said at least one sensor comprises two sensors arranged in a mutual displacement angle of 90 degrees in a plane perpendicular to said rotational axis of said operating device.

18. A sensor system according to claim 9, wherein said operating device comprises an extension device extending from said valve.

19. A sensor system according to claim 9, wherein said at least one reference part or said at least one sensor is held in a fixed position in relation to said valve.

20. A sensor system according to claim 9, wherein said least one reference position comprises at least a first reference position corresponding to said blocking element being in one of a fully closed or a fully open position, and a second reference position corresponding to said blocking element being in the other of said fully closed or fully open position.

21. A sensor system according to claim 9, wherein at least said at least one sensor, said memory, said input receiver and said processor are formed as a single interconnected unit.

22. A sensor system according to claim 9, wherein said sensor system further comprises a temperature sensor.

23. A sensor system according to claim 9, wherein said memory comprises a memory for storing at least two reference positions.

24. A sensor system according to claim 9, wherein the valve is a multi-turn valve.

\* \* \* \* \*